United States Patent [19]

Widdershoven et al.

[11] Patent Number: 5,299,247

[45] Date of Patent: Mar. 29, 1994

[54] SIGNAL PROCESSING DEVICE HAVING FREQUENCY-ADAPTIVE SAMPLING

[75] Inventors: Franciscus P. Widdershoven; Jan Haisma, both of Eindhoven, Netherlands

[73] Assignee: U.S. Philips Corporation, New York, N.Y.

[21] Appl. No.: 960,677

[22] Filed: Oct. 14, 1992

[30] Foreign Application Priority Data

Oct. 15, 1991 [EP] European Pat. Off. ......... 91202661.4

[51] Int. Cl.$^5$ ..................... G11C 19/28; H03K 21/08
[52] U.S. Cl. ........................... 377/60; 377/62; 257/254; 257/416
[58] Field of Search ............... 357/254, 416; 377/60, 377/62

[56] References Cited

FOREIGN PATENT DOCUMENTS 003922671 1/1991 Fed. Rep. of Germany ...... 257/416

OTHER PUBLICATIONS

"Acoustic wave amplifier having a coupled semiconductor Layer", Farg et al., IBM Tech. Disc. Bull. vol. 13 No. 11 Apr. 1971 p. 3487.
"PT Elektronica-Elektrotechniek" No. 4, Apr. 1990, pp. 38-39.
J. Vac. Sci., Technol. B6(2), Mar./Apr. 1988, pp. 685-687.
"Surface Excitations" by V. M. Agranovich & R. Loudon (1984) p. 249.

*Primary Examiner*—Margaret R. Wambach
*Attorney, Agent, or Firm*—Steven R. Biren

[57] ABSTRACT

The invention provides a signal processing device including sampling means (31, 41, 32) for sampling an input signal in the form of charge carrier packages and a shift register (4) having an input region (41) to which a signal sample is offered during operation, and provided with transport means (2) for transporting the signal sample to an output region (42) of the shift register. The device according to the invention is capable of adapting itself to the frequency with which the input signal is sampled in such a way that the storage of the increase in signal samples which accompanies an increase in the sampling frequency does not require additional space. For this purpose, according to the invention, the shift register comprises a transport channel (4) in which an electron-hole liquid can exist. The sampling means (31, 41, 32) are capable of sampling the input signal in the form of electron-hole droplets (71 ... 74) which are transported through the shift register by means of an acoustic wave generated by the transport means.

9 Claims, 2 Drawing Sheets

SIGNAL PROCESSING DEVICE HAVING FREQUENCY-ADAPTIVE SAMPLING

BACKGROUND OF THE INVENTION

The invention relates to a signal processing device comprising sampling means for sampling an input signal in the form of charge carrier packages and a shift register provided with an input region to which a signal sample is offered during operation, and with transport means for transporting the signal sample to an output region of the shift register.

Such a device is described in "PT Elektronica-Elektrotechniek" no. 4, April 1990, pp. 38-39, where the device is used in a memory oscilloscope for high-frequency input signals. In the known device, the shift register is formed by a charge-coupled device (CCD) comprising a series of gate electrodes situated one after the other and separated from a subjacent p-type semiconductor region by an insulating layer. The gate electrodes are connected to clocking means which during operation generate clock voltages by which local potential minima are generated in the semiconductor region. Such a potential minimum is formed by means of four gate electrodes situated next to one another and forms a cell in which a signal sample can be stored. The signal sample can then be shifted from cell to cell by the CCD under the influence of the clock voltages. The signal samples are shifted further by the CCD until the oscilloscope is triggered, which freezes the condition of the CCD. Subsequently, the discrete samples are read out from the shift register at a sufficiently low speed for reconstructing and displaying the input signal.

A signal which does not contain significant frequency components above f Hz can in principle be reconstructed from a series of samples thereof if the time interval between consecutive signal samples is smaller than ½.f second. This means that in proportion as the frequency of the input signal is higher, more signal samples are to be taken per unit time in order to enable a faithful reconstruction of the signal.

The known device in which each signal sample lies in storage below four gate electrodes of the CCD has the disadvantage that the size of the shift register will have to increase considerably in proportion as a greater frequency range of the is required. In addition, the upper limit of the frequency range is a fixed quantity for a device of the known type having a given number of gate electrodes.

SUMMARY OF THE INVENTION

The invention has for its object inter alia to provide a signal processing device of the kind mentioned in the opening paragraph fitted with a shift register which is capable of adapting itself to the frequency with which the input signal is sampled in such a way that the storage of the increased number of signal samples which accompanies a rise in the sampling frequency does not require additional space.

According to the invention, a device of the kind mentioned in the opening paragraph is for this purpose characterized in that the shift register comprises a transport channel in which an electron-hole liquid can exist, in that the sampling means are capable of sampling the input signal in the form of electron-hole droplets, and in that the transport means comprise means for generating an acoustic wave and passing the latter through the transport channel.

In this connection, an electron-hole liquid is understood to mean a set of electron-hole pairs which are mutually bound in the form of excitons and which are in a condensed state. Further requirements which are imposed on a material in order to form such a liquid will be discussed below in the description of the Figures. For an extensive treatment of electron-hole liquids in semiconductor materials the reader is referred to the handbook "Modern Problems in Condensed Matter Sciences" vol. 6: *Electron-Hole Droplets in Semiconductors*, North-Holland, 1983 by C. D. Jeffries and L. V. Keldysh.

Such a liquid is electrically substantially neutral and as a result cannot or can substantially not be transported under the influence of an electric field, as can, for example, an electron package in the known device. An electron-hole liquid, however, is sensitive to mechanical tensions and will strive to attain a minimum energy in a corresponding field of tension. Such a field of tension can be induced by means of an acoustic wave, so that transport by means of an acoustic wave is possible.

The transport means generate an acoustic wave which propagates itself through the transport channel of the shift register. Depending on the material of the relevant medium and the type of acoustic wave, the signal sample in the field of tension of the acoustic wave will experience an energy minimum locally. If the amplitude of the acoustic wave is sufficiently large, the signal sample will be trapped in such an energy minimum and travel along with the wave. In this way a series of signal samples can be stored and transported in the transport channel, each in a separate energy minimum. The distance between the discrete signal samples then is equal to the wavelength of the acoustic wave, which is given by the quotient of the rate of propagation of the wave in the relevant medium to the frequency of the wave. The shift register thus comprises a number of separate, equidistant cells whose interspacing is determined by the wavelength of the acoustic wave.

In proportion as the frequency of the acoustic wave is greater, the wavelength and the corresponding interspacing between the cells of the shift register will be smaller. As a result, more signal samples per unit area can be stored in the shift register according to the invention in proportion as the frequency of the acoustic wave is chosen to be greater.

In a practical embodiment, the sampling means and the transport means according to the invention are operated at the same frequency. The frequency of the acoustic wave is then always equal to the sampling frequency. If the sampling frequency is chosen to be higher, and accordingly more signal sample are to be stored, the shift register according to the invention will automatically adapt to this higher sampling frequency by offering space to more signal samples. The device according to the invention can thus be operated at a higher sampling frequency without requiring a larger shift register, thus counteracting the disadvantages of the known device.

It is noted in this connection that it is known per se from "J. Vac. Sci. Technol. B6(2), Mar/Apr 1988, pp. 685-687" to transport charge by means of an acoustic wave. In that case, however, the charge is not condensed into a droplet during transport so that the charge package as a whole is charged and the charge density is considerably lower than in the device according to the invention.

BRIEF DESCRIPTION OF THE DRAWING

The invention will now be explained in more detail with reference to the drawing, in which.

Figure 1:
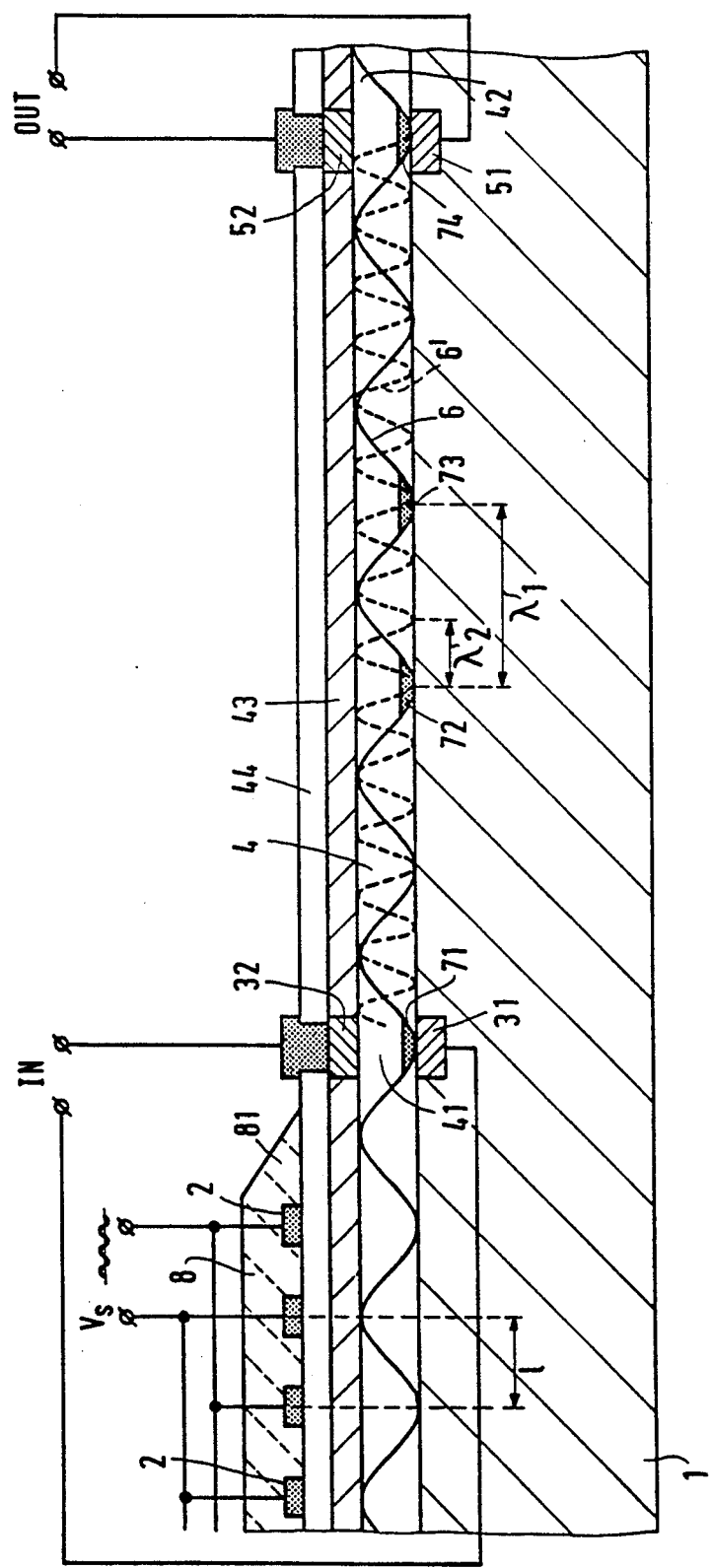
FIG. 1 shows a first embodiment of the device according to the invention.

The Figures are purely diagrammatic and not drawn to scale. In particular, some dimensions are strongly exaggerated for greater clarity. Semiconductor regions of the same conductivity type are hatched in the same direction as much as possible, and corresponding parts have been given the same reference numerals.

DESCRIPTION OF THE PREFERRED EMBODIMENTS

The device of FIG. 1 comprises a monocrystalline substrate 1 of undoped or scarcely doped silicon on which transport means 2, sampling means 31, 32, a shift register 4 and readout means 51, 52 are provided together.

The transport means are formed by an acoustic transducer built up from a number of metal fingers 2 which are provided at a mutual interspacing 1 and are coated with a zinc oxide layer 8. The transducer is connected to a high-frequency AC-voltage $V_s$, in this example a sine wave, under the influence of which a periodic deformation of the zinc oxide layer 8 occurs at the area of the fingers 2 so that an acoustic wave is emitted in lateral direction, in particular in the direction of the shift register 4 in which the wave will propagate further. The sloping edge 81 at the zinc oxide layer 8 ensures a gradual transition from the zinc oxide layer 8 to the portion where the shift register 4 is situated. Such a transducer is described on page 249 of the handbook "Surface Excitations" by V. M. Agranovich & R. Loudon (editors), North-Holland (1984), the contents of which are deemed to be included herein. The frequency $f_s$ of the acoustic wave is equal to $v_c/2l$ or an odd multiple thereof, in which $v_c$ is the propagation rate of the wave in the relevant medium. The frequency of the acoustic wave can be set for the required value in that the AC-voltage $V_s$ is attuned to one of these frequencies.

The shift register in this example comprises a track 4 of monocrystalline silicon germanide in which silicon is present to a fraction of approximately 15%. The track 4 has a height and width of approximately 0.2 μm and 2 μm, respectively, and is approximately 500 μm long. The semiconductor track 4 forms a transport channel in which an electron-hole liquid can exist below approximately 20K. An electron-hole liquid in this connection is understood to be a collection of electron-hole pairs which are mutually bound so as to form excitons and which are in a condensed state. For forming such a liquid, both electrons and holes must be mobile in the material and their mutual binding energy must exceed their thermal energy: k.T, in which k is Boltzmann's constant and T is the temperature. In addition, the interaction among excitons which keeps the excitons together as a liquid must be greater than the thermal energy of the excitons. In practice, this will often mean that the device must be cooled. The device of the present example, therefore, is provided with cooling means (not drawn), with which the device is kept at an operating temperature of approximately 4K, i.e. the boiling point of liquid helium.

At a sufficiently low temperature, semiconductor materials in monocrystalline form other than silicon germanide also meet the said conditions. Preferably, an indirect semiconductor material is used for the shift register because the electron-hole pairs have a comparatively long life therein. Other suitable materials are, for example, germanium, silicon, gallium phosphide (GaP) and gallium sulphide (GaS). The temperature below which an electron-hole liquid can exist in these materials varies from 8K in germanium, approximately 28K in silicon and 40K in gallium phosphide to approximately 130K in gallium sulphide. This latter material has the additional advantage that the condensed electron-hole pairs therein have a comparatively great density. The density of an electron-hole liquid in GaS is approximately $2 \times 10^{20}$ charge carriers per cm$^3$, which is greater than the electron density in a conventional charge-coupled device by approximately a factor one thousand. As a result, approximately one thousand times more charge carriers can be stored in a cell of the shift register according to the invention, per unit volume, than in a corresponding cell of a conventional shift register.

The track 4 is coated with a silicon layer 43 to confine the electron-hole liquid in the track 4. The liquid experiences a considerably higher energy level in silicon than in the silicon germanide of the conductor track 4. As a result, the liquid will not or substantially not leave the track 4. At the lower side of the track 4, the silicon substrate 1 ensures the desired confinement of the liquid. The silicon layer 43 in its turn is coated with an insulating layer 44 of silicon oxide, which passivates the device and which in addition provides the electrical insulation of the fingers 2 of the transducer.

The device is further provided with sampling means. To this end, two silicon regions 31, 32 are n-type and p-type doped, respectively, near the transducer 2 at opposite sides of the track 4. The two regions 31, 32 together with an input region 41 of the shift register, which is not or substantially not doped, form a PIN diode. The input signal IN to be sampled, possibly increased by a constant offset voltage, is offered between the two regions 31, 32 through diagrammatically depicted connection electrodes, so that the PIN diode 31, 41, 32 is forward biased and electrons from the n-type semiconductor layer 31 and holes from the p-type semiconductor layer 32 are injected into the input region 41.

The injected holes and electrons condense into an electron-hole droplet in the input region 41. The size of the droplet is determined by the value of the input signal and the integration time τ during which the input signal is sampled. The droplet formed is sensitive to mechanical tension in the crystal lattice caused by the acoustic wave propagating therein. In the case of the silicon germanide used here which has a cubic crystal lattice which is tetragonally deformed owing to the difference in lattice spacing with the subjacent Si substrate, the droplet experiences an energy minimum at the area of a pressure maximum of the acoustic wave. Depending on the material chosen for the semiconductor track, however, it is alternatively possible for such an energy minimum to coincide with a pressure minimum.

The acoustic transducer 2 and the sampling means are so synchronized that the injection of electrons and holes into the input region 41 coincides with the passage of a pressure maximum of the acoustic wave. The droplet is then caught in the passing energy minimum corresponding thereto and will travel along with the wave. In this manner a series of signal samples can be stored in the semiconductor track 4, each in a separate energy minimum, and be transported to an output region 42 of this track.

In FIG. 1, an instantaneous picture of the energy fluctuation in the semiconductor track 4 as a result of the acoustic wave is diagrammatically depicted with the curve 6, and a number of the said signal samples 71–74 are drawn therein. The distance $\lambda_1$ between adjoining energy minima is equal to the wavelength of the acoustic wave in the semiconductor track 4. In this case, where the frequency of the acoustic wave is equal to the sampling frequency $f_s$, we therefore get: $\lambda_1 = v_c/f_s$, in which $v_c$ is the propagation rate of the wave.

It is clear from this relation that the interspacing between discrete signal samples decreases as the sampling frequency $f_s$ increases. To illustrate this, FIG. 1 also shows the energy line 6' corresponding to a sampling frequency which is approximately three times higher. The interspacing $\lambda_2$ between consecutive energy minima in that case is approximately three times smaller. So more signal samples can be stored in the shift register 4 per unit area in proportion as the sampling frequency is increased. The shift register 4 then automatically adapts itself to a higher sampling frequency.

In the output region 42, the semiconductor track is provided with a detector comprising two doped silicon regions 51, 52 which adjoin the output region 42, which is not or substantially not doped, at opposing sides and which form a PIN diode with said region comparable to the regions 31 and 32 adjoining the input region 41. The layers 51, 52 are n-type and p-type doped, respectively, and each provided with electrical connections through which the PIN diode is reverse biased during operation. The moment a droplet 74 arrives in the output region 42, the electrons and holes therein are separated under the influence of the reverse-bias field and discharged towards the n-type semiconductor layer 51 and the p-type semiconductor layer 52, respectively. This causes a current pulse whose value depends inter alia on the size of the detected droplet 74. This current pulse may be taken off as an analog or a digital output signal OUT, depending on the application, through diagrammatically depicted connection electrodes.

Figure 2:
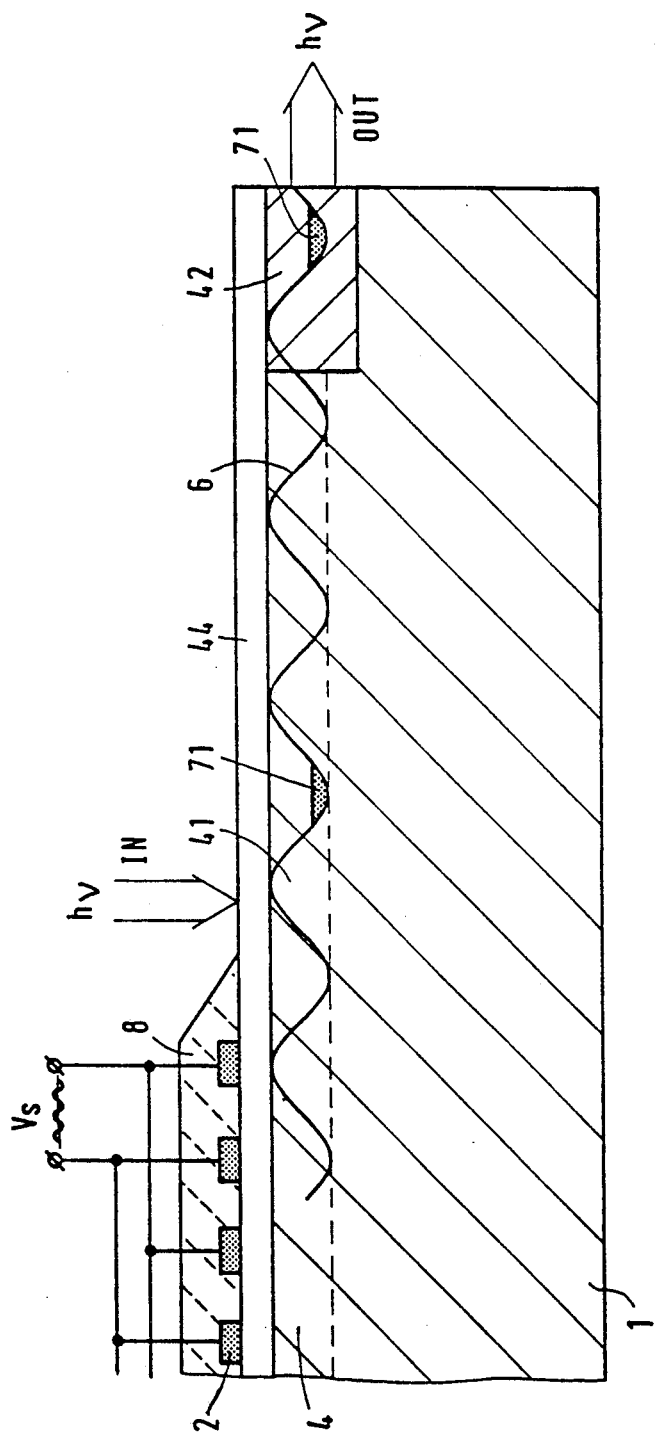
FIG. 2 shows a second embodiment of the device according to the invention.

FIG. 2 shows a second embodiment of the device according to the invention. The device shown comprises a substrate 1 of monocrystalline silicon which is not intentionally doped with a (001) oriented surface which is covered with a silicon oxide layer 44. The device is provided with cooling means (not shown) for keeping the device at an operating temperature of approximately 4 K. An electron-hole liquid can exist in the substrate 1 at such a temperature.

The substrate 1 is provided with an input region 41 to which an input signal IN is offered in the form of radiation during operation. As a result of the radiation, electrons will be excited from the valency band to the conduction band in the input region 41, thus leaving holes in the valency band. The excited electrons are mobile, as are the holes left behind in the valency band, and together with the holes form hole-electron pairs which at the said temperature will condense into an electron-hole droplet 71. The size of the droplet in this case depends on the intensity of the offered radiation IN and on the integration time $\tau$ during which the input region 41 was exposed to the radiation. The droplet 71 formed thus constitutes a signal sample which can be transported under the influence of an acoustic wave.

To generate such a wave, the device is fitted with an acoustic transducer, provided on the oxide layer 44. As in the previous example, the transducer comprises a number of metal fingers 2 which are embedded in a zinc oxide layer 8. The transducer is connected to an AC-voltage $V_s$ and generates an acoustic wave which is transmitted to the substrate 1 during operation. In the substrate 1, the wave propagates parallel to the surface, not penetrating the substrate 1 further than one wavelength deep. Thus it is possible to distinguish in the substrate 1 a top layer 4 with a thickness of approximately the wavelength of the acoustic wave, in which top layer the acoustic wave propagates laterally. The top layer 4 thus forms a transport channel in which information can be stored and transported in the form of electron-hole droplets 71.

The frequency of the acoustic wave is substantially equal to the frequency of the offered AC-signal $V_s$ and can be attuned stepwise to an odd multiple of $v_c/2l$, in which $v_c$ is the rate of propagation of the wave in the relevant medium and l is the interspacing between the fingers 2 of the transducer. The frequency of the acoustic wave at the same time forms the sampling frequency, which is taken to be larger than 2 .f, in which f is the frequency of the highest significant frequency component of the input signal IN to be sampled.

The acoustic wave causes a mechanical field of tension in the substrate 1 in which an electron-hole droplet experiences an energy minimum near the surface in a direction transverse to the surface. In a direction parallel to the surface, the droplet experiences energy minima at the areas of the pressure maxima of the wave. The curve 6 diagrammatically shows the energy fluctuation as a result of the acoustic wave in the direction parallel to the surface. An electron-hole droplet 71 will be pressed against the surface and, caught in an energy minimum, travel along with the wave and be transported to an output region 42.

Grooves extending through the top layer 4 and enclosing the droplet 71 in a direction transverse to the plane of the drawing are provided in the substrate 1 parallel to the direction of propagation of the wave. The grooves may be filled with silicon oxide which is provided, for example, simultaneously with the silicon oxide layer 44.

The output region 42 is formed by a region of direct semiconductor material, in this example doped indium gallium arsenide in which indium and gallium are present in a mutual ratio of approximately 4:6 ($In_{0.4}Ga_{0.6}As$), which laterally adjoins the top layer 4 and in which the electrons and holes of an electron-hole droplet have a considerably shorter life, or considerably greater recombination rate than in the top layer 4 itself. Once arrived in the output region 42, an electron-hole droplet 71 will almost immediately decay under the emission of radiation. The intensity of the emitted radiation will then depend on the size of the droplet 71. The emitted radiation can be taken off at the output of the device as an optical output signal OUT.

Although the invention has been described with reference to only a few embodiments, it will be obvious that the invention is by no means limited to the examples given. Many variations are possible to those skilled in the art within the scope of the invention.

Thus, the anode and cathode of the sampling means and the detector in the first embodiment may be provided on either side of the shift register instead of above and below it. The sampling means and detector of the two embodiments may also be interchanged. In that case the device according to the invention is also capable of converting an optical input signal into an electrical output signal, or vice versa.

It is furthermore possible to equip the shift register with several detectors positioned one after the other, so that several samples can be read out simultaneously in parallel or a selection can be made from several samples offered.

The device according to the invention may alternatively be equipped with a number of shift registers instead of with a single shift register, for example, formed by a number of parallel conductor tracks. The transport means in this case may be used collectively for the tracks, but it is alternatively possible to provide each semiconductor track separately with its own transport means.

We claim:

1. A signal processing device comprising sampling means for sampling an input signal in the form of charge carrier packages and a shift register provided with an input region to which a signal sample is provided during operation, and with transport means for transporting the signal sample to an output region of the shift register, characterized in that the shift register comprises a transport channel in which an electron-hole liquid can exist, in that the sampling means are capable of sampling the input signal in the form of electron-hole droplets, and in that the transport means comprises means for generating an acoustic wave and passing the latter through the transport channel.

2. A device as claimed in claim 1, characterized in that the transport channel is formed by a track of monocrystalline semiconductor material.

3. A device as claimed in claim 2, characterized in that the track comprises an indirect semiconductor material selected from a group consisting of Ge, Si, GaP and GaS.

4. A device as claimed in claim 2, characterized in that the conductor track is coated with a confinement layer which is at least substantially impermeable to the electron-hole liquid.

5. A device as claimed in claim 1, characterized in that the sampling means comprises a PIN diode comprising a first semiconductor region of a first conductivity type, a second semiconductor region of a second, opposite conductivity type, and an interposed third semiconductor region which is at least substantially undoped, in that the third semiconductor region is formed by the input region of the shift register, and in that the first and the second semiconductor region are provided with connection means for the input signal.

6. A device as claimed in claim 1, characterized in that the device is further provided with a detector in the form of a PIN diode, comprising a first semiconductor region of a first conductivity type, a second semiconductor region of a second, opposite conductivity type, and an interposed third semiconductor region which is at least substantially undoped, in that the third semiconductor region is formed by the output region of the shift register, and in that the first and the second semiconductor region are provided with means for reverse-biasing the PIN diode during operation.

7. A device as claimed in claim 1, characterized in that the output region comprises a material which is capable of causing an electron-hole liquid to decay under the emission of radiation.

8. A device as claimed in claim 7, characterized in that the output region comprises a direct semiconductor material.

9. A device as claimed in claim 1, characterized in that the transport means comprises an acoustic transducer.

* * * * *